US012794465B2

(12) United States Patent
Adachi et al.
(10) Patent No.: US 12,794,465 B2
(45) Date of Patent: Nov. 10, 2026

(54) SEMICONDUCTOR DEVICE AND SEMICONDUCTOR MODULE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kento Adachi, Tokyo (JP); Tatsunori Sakano, Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 9 days.

(21) Appl. No.: 19/006,508

(22) Filed: Dec. 31, 2024

(65) Prior Publication Data

US 2025/0226823 A1 Jul. 10, 2025

(30) Foreign Application Priority Data

Jan. 4, 2024 (JP) ................................ 2024-000304

(51) Int. Cl.
*H03K 17/567* (2006.01)

(52) U.S. Cl.
CPC .................................. *H03K 17/567* (2013.01)

(58) Field of Classification Search
CPC ......... H03K 17/567; H03K 2217/0063; H03K 2217/0072; H03K 17/127; H03K 17/168; H03K 17/0822; H03K 17/687; H03K 17/6871; H03K 2217/0081; H03K 17/122; H03K 2217/0027; H03K 17/0828; H03K 2217/0036; H03K 17/162; H03K 17/063; H03K 17/163; H03K 17/145; H03K 2217/0009; H03K 3/012; H03K 17/08104; H03K 17/165; H03K 17/60; H03K 17/08128; H03K 2217/0018; H03K 17/06; H03K 2017/0806; H03K 17/14;
(Continued)

(56) References Cited

U.S. PATENT DOCUMENTS

2008/0117557 A1 * 5/2008 Mamitsu .......... H03K 17/08128 361/56
2009/0059999 A1 * 3/2009 Shoda ...................... G01K 7/01 374/185
(Continued)

FOREIGN PATENT DOCUMENTS

JP 2021141304 A 9/2021

*Primary Examiner* — John W Poos
(74) *Attorney, Agent, or Firm* — Maier & Maier, PLLC

(57) ABSTRACT

An on-period of a second gate electrode is shorter than an on-period of a first gate electrode in a period from when the first gate electrode is turned on until the first gate electrode is turned off. An on-period of a third gate electrode is shorter than the on-period of the second gate electrode in the period from when the first gate electrode is turned on until the first gate electrode is turned off. A timing at which a third gate voltage of the third gate electrode reaches a third threshold voltage and a start timing of a third Miller period of the third gate voltage are within a first Miller period of a first gate voltage of the first gate electrode and within a second Miller period of a second gate voltage of the second gate electrode.

8 Claims, 7 Drawing Sheets

(58) Field of Classification Search
CPC .................... H03K 17/16; H03K 17/18; H03K 2017/6878; H03K 17/78; H03K 17/04113; H03K 17/08; H03K 17/08122; H03K 17/04206; H03K 17/04106; H03K 17/0406; H03K 17/102; H03K 17/74; H03K 3/013; H03K 2217/94042; H03K 17/691; H03K 2017/6875; H03K 17/04123; H03K 17/0812; H03K 17/166; H03K 17/6877; H03K 2017/066; H03K 17/08148; H03K 17/56; H03K 19/018521; H03K 2217/0045; H03K 17/00; H03K 17/08142; H03K 17/082; H03K 17/0826; H03K 17/302; H03K 7/08; H03K 17/164; H03K 17/785; H03K 2017/307; H03K 2217/009; H03K 17/161; H03K 17/223; H03K 17/602; H03K 17/61; H03K 17/7955; H03K 5/04; H03K 17/04; H03K 17/64; H03K 3/356113; H03K 17/0412; H03K 17/10; H03K 19/00315; H03K 19/0185; H03K 19/20; H03K 2005/00058; H03K 2217/0054; H03K 3/01; H03K 3/353; H03K 5/14; H03K 17/081; H03K 17/12; H03K 17/28; H03K 17/6872; H03K 17/6874; H03K 17/689; H03K 19/00369; H03K 19/00384; H03K 19/018507; H03K 3/021; H03K 3/356; H03K 5/01; H03K 5/08; H03K 17/002; H03K 17/08116; H03K 17/107; H03K 17/284; H03K 17/30; H03K 17/52; H03K 17/54; H03K 17/603; H03K 17/6257; H03K 17/795; H03K 19/007; H03K 19/017509; H03K 19/017518; H03K 19/21; H03K 3/037; H03K 3/26; H03K 17/0403; H03K 17/041; H03K 17/04126; H03K 17/042; H03K 17/133; H03K 17/22; H03K 17/296; H03K 17/615; H03K 17/66; H03K 17/693; H03K 17/723; H03K 17/732; H03K 17/90; H03K 19/00307; H03K 19/00353; H03K 19/00361; H03K 19/017; H03K 19/018514; H03K 19/018585; H03K 19/08; H03K 19/094; H03K 19/0944; H03K 19/09443; H03K 19/09448; H03K 3/356104; H03K 3/53; H03K 5/15; H03K 5/24; H03K 5/2472
See application file for complete search history.

(56) References Cited

U.S. PATENT DOCUMENTS

| | | | | |
|---|---|---|---|---|
| 2019/0058468 | A1* | 2/2019 | Okayama ........... | H03K 17/0828 |
| 2021/0281258 | A1 | 9/2021 | Sakano et al. | |
| 2022/0014184 | A1* | 1/2022 | Sato ..................... | H10D 89/811 |

* cited by examiner

SEMICONDUCTOR DEVICE AND SEMICONDUCTOR MODULE

CROSS-REFERENCE TO RELATED APPLICATION

This application is based upon and claims the benefit of priority from Japanese Patent Application No. 2024-000304, filed on Jan. 4, 2024; the entire contents of which are incorporated herein by reference.

FIELD

Embodiments described herein relate generally to a semiconductor device and a semiconductor module.

BACKGROUND

IGBTs (Insulated Gate Bipolar Transistors) are widely used as power semiconductor devices that control high breakdown voltages and large currents. It is desirable for an IGBT used as a switching element to have a low turn-on loss. Therefore, an IGBT that has a triple-gate structure has been proposed, in which the gate electrodes are divided into three systems, and the turn-on loss can be reduced by driving the gate electrodes of the third system only at turn-on.

DETAILED DESCRIPTION

Figure 1:
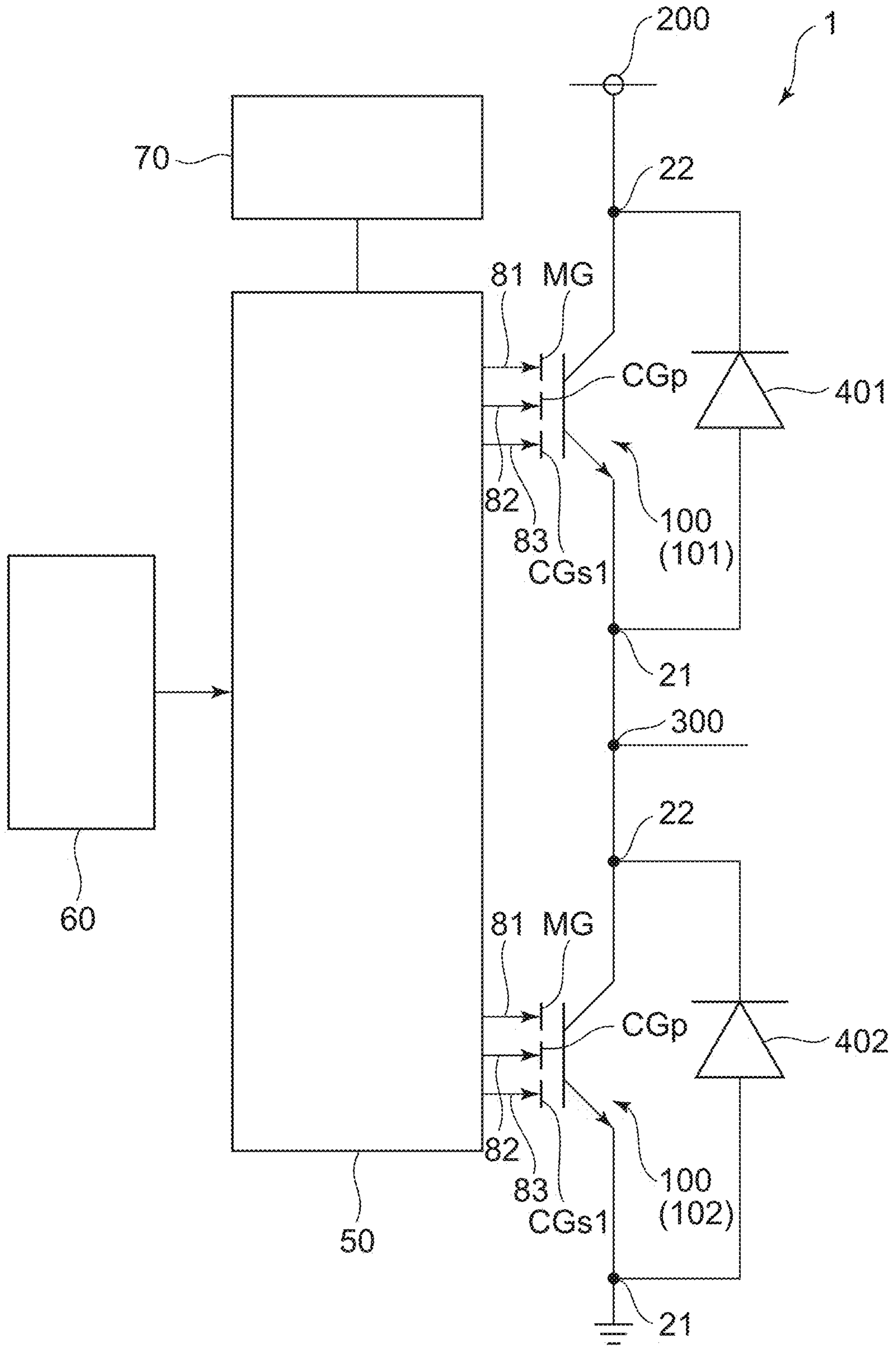
FIG. 1 is a schematic view showing a configuration of a semiconductor module of an embodiment.

According to one embodiment, a semiconductor device includes a first gate electrode, a second gate electrode, and a third gate electrode, the first gate electrode, the second gate electrode, and the third gate electrode being configured to be controlled independently from each other, an on-period of the second gate electrode being shorter than an on-period of the first gate electrode in a period from when the first gate electrode is turned on until the first gate electrode is turned off, an on-period of the third gate electrode being shorter than the on-period of the second gate electrode in the period from when the first gate electrode is turned on until the first gate electrode is turned off, a timing at which a third gate voltage of the third gate electrode reaches a third threshold voltage and a start timing of a third Miller period of the third gate voltage being within a first Miller period of a first gate voltage of the first gate electrode and within a second Miller period of a second gate voltage of the second gate electrode.

Exemplary embodiments will now be described with reference to the drawings.

The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

First Embodiment

As shown in FIG. 1, a semiconductor module 1 of a first embodiment includes a first semiconductor device 101, a second semiconductor device 102, and a drive device 50 that drives the first semiconductor device 101 and the second semiconductor device 102.

For example, the first semiconductor device 101 and the second semiconductor device 102 include IGBTs and have the same configuration. In the specification, the first semiconductor device 101 and the second semiconductor device 102 may be called simply the semiconductor device 100 without differentiation.

The first semiconductor device 101 and the second semiconductor device 102 each include a collector electrode 22, an emitter electrode 21, a first gate electrode MG, a second gate electrode CGp, and a third gate electrode CGs1. The first gate electrode MG, the second gate electrode CGp, and the third gate electrode CGs1 are configured to be controlled electrically independently from each other.

The first semiconductor device 101 and the second semiconductor device 102 are connected in series between a voltage source 200 and ground. The collector electrode 22 of the first semiconductor device 101 is connected to the voltage source 200; the emitter electrode 21 of the first semiconductor device 101 is connected to the collector electrode 22 of the second semiconductor device 102; and the emitter electrode 21 of the second semiconductor device 102 is connected to ground. The connection point (a neutral point) 300 between the emitter electrode 21 of the first semiconductor device 101 and the collector electrode 22 of the second semiconductor device 102 is connected to a load (not illustrated).

A first freewheeling diode 401 is connected in parallel to the first semiconductor device 101 between the voltage source 200 and the neutral point 300. The forward direction of the first freewheeling diode 401 is the direction from the neutral point 300 toward the voltage source 200. A second freewheeling diode 402 is connected in parallel to the second semiconductor device 102 between the neutral point 300 and ground. The forward direction of the second freewheeling diode 402 is the direction from ground toward the neutral point 300. The first freewheeling diode 401 and the second freewheeling diode 402 are, for example, Schottky barrier diodes.

The drive device 50 is electrically connected with the gate electrodes of the first and second semiconductor devices 101 and 102 and applies gate voltages to the gate electrodes of the first and second semiconductor devices 101 and 102. The gate voltages are, for example, gate potentials referenced to the emitter potential. The drive device 50 is electrically connected with the first gate electrodes MG of the semiconductor devices 101 and 102 via first gate wiring parts 81. The drive device 50 is electrically connected with the second gate electrodes CGp of the semiconductor devices 101 and 102 via second gate wiring parts 82. The drive device 50 is electrically connected with the third gate electrodes CGs1 of the semiconductor devices 101 and 102 via third gate wiring parts 83.

The semiconductor module 1 may include a pulse generator 60 and a control device 70. The pulse generator 60 outputs a pulse signal to the drive device 50; and the drive device 50 applies pulsed gate voltages to the gate electrodes of the first and second semiconductor devices 101 and 102 according to the pulse signal from the pulse generator 60. The output of the pulse generator 60 is connected with the input of the drive device 50. The control device 70 controls the drive device 50.

An example of the structure of the semiconductor device 100 (the first semiconductor device 101 and the second semiconductor device 102) will now be described with reference to FIG. 2.

For example, the semiconductor device 100 has a trench-gate structure. The semiconductor device 100 includes the emitter electrode 21, the collector electrode 22, a semiconductor part 10, the first gate electrode MG, the second gate electrode CGp, the third gate electrode CGs1, a first insulating film 41, a second insulating film 42, and a third insulating film 43. In FIG. 2, the emitter electrode 21 is illustrated by double dot-dash lines to clearly show the surface of the semiconductor part 10 covered with the emitter electrode 21.

The emitter electrode 21 and the collector electrode 22 are separated from each other in a first direction Z. In FIG. 2, two directions orthogonal to the first direction Z are taken as a second direction X and a third direction Y. The second direction X and the third direction Y are orthogonal to each other.

The semiconductor part 10 is located between the emitter electrode 21 and the collector electrode 22 in the first direction Z. The material of the semiconductor part 10 is, for example, silicon. The material of the semiconductor part 10 may be, for example, silicon carbide, gallium nitride, etc.

The semiconductor part 10 includes a first semiconductor layer 11 of a first conductivity type, a second semiconductor layer 12 of a second conductivity type, a third semiconductor layer 13 of the first conductivity type, and a fourth semiconductor layer 14 of the second conductivity type. According to the embodiment, for example, the first conductivity type is an n-type; and the second conductivity type is a p-type.

The semiconductor part 10 includes multiple mesa parts 30 separated from each other in the second direction X. Each mesa part 30 extends in the third direction Y. Each mesa part 30 includes the third semiconductor layer 13, the second semiconductor layer 12, and a portion of the first semiconductor layer 11. The mesa part 30 also may include a fifth semiconductor layer 15 described below.

The first semiconductor layer 11 is, for example, an n-type drift layer of the IGBT. The second semiconductor layer 12 is, for example, a p-type base layer of the IGBT. The second semiconductor layer 12 is positioned between the first semiconductor layer 11 and the third semiconductor layer 13 in the first direction Z.

The third semiconductor layer 13 is, for example, an n-type emitter layer of the IGBT. The n-type impurity concentration of the third semiconductor layer 13 is greater than the n-type impurity concentration of the first semiconductor layer 11. The third semiconductor layer 13 is positioned between the second semiconductor layer 12 and the emitter electrode 21 in the first direction Z and is electrically connected with the emitter electrode 21.

The fourth semiconductor layer 14 is, for example, a p-type collector layer of the IGBT. The p-type impurity concentration of the fourth semiconductor layer 14 is greater than the p-type impurity concentration of the second semiconductor layer 12. The fourth semiconductor layer 14 is positioned between the collector electrode 22 and the first semiconductor layer 11 in the first direction Z and is electrically connected with the collector electrode 22.

The semiconductor part 10 can further include the fifth semiconductor layer 15 of the second conductivity type and a sixth semiconductor layer 16 of the first conductivity type.

The fifth semiconductor layer 15 is, for example, a p-type base contact layer of the IGBT. The p-type impurity concentration of the fifth semiconductor layer 15 is greater than the p-type impurity concentration of the second semiconductor layer 12. The fifth semiconductor layer 15 is positioned between the second semiconductor layer 12 and the emitter electrode 21 and is electrically connected to the second semiconductor layer 12 and the emitter electrode 21. For example, the third semiconductor layer 13 and the fifth semiconductor layer 15 are alternately arranged in the third direction Y on the second semiconductor layer 12 of the mesa part 30.

The sixth semiconductor layer 16 is, for example, an n-type buffer layer of the IGBT. The n-type impurity concentration of the sixth semiconductor layer 16 is greater than the n-type impurity concentration of the first semiconductor layer 11. The sixth semiconductor layer 16 is positioned between the fourth semiconductor layer 14 and the first semiconductor layer 11 in the first direction Z.

The first gate electrode MG, the second gate electrode CGp, and the third gate electrode CGs1 are positioned between the semiconductor part 10 and the emitter electrode 21 in the first direction Z. The first gate electrode MG, the second gate electrode CGp, and the third gate electrode CGs1 are electrically isolated from each other. For example, polycrystalline silicon can be used as the material of the first, second, and third gate electrodes MG, CGp, and CGs1.

Figure 2:
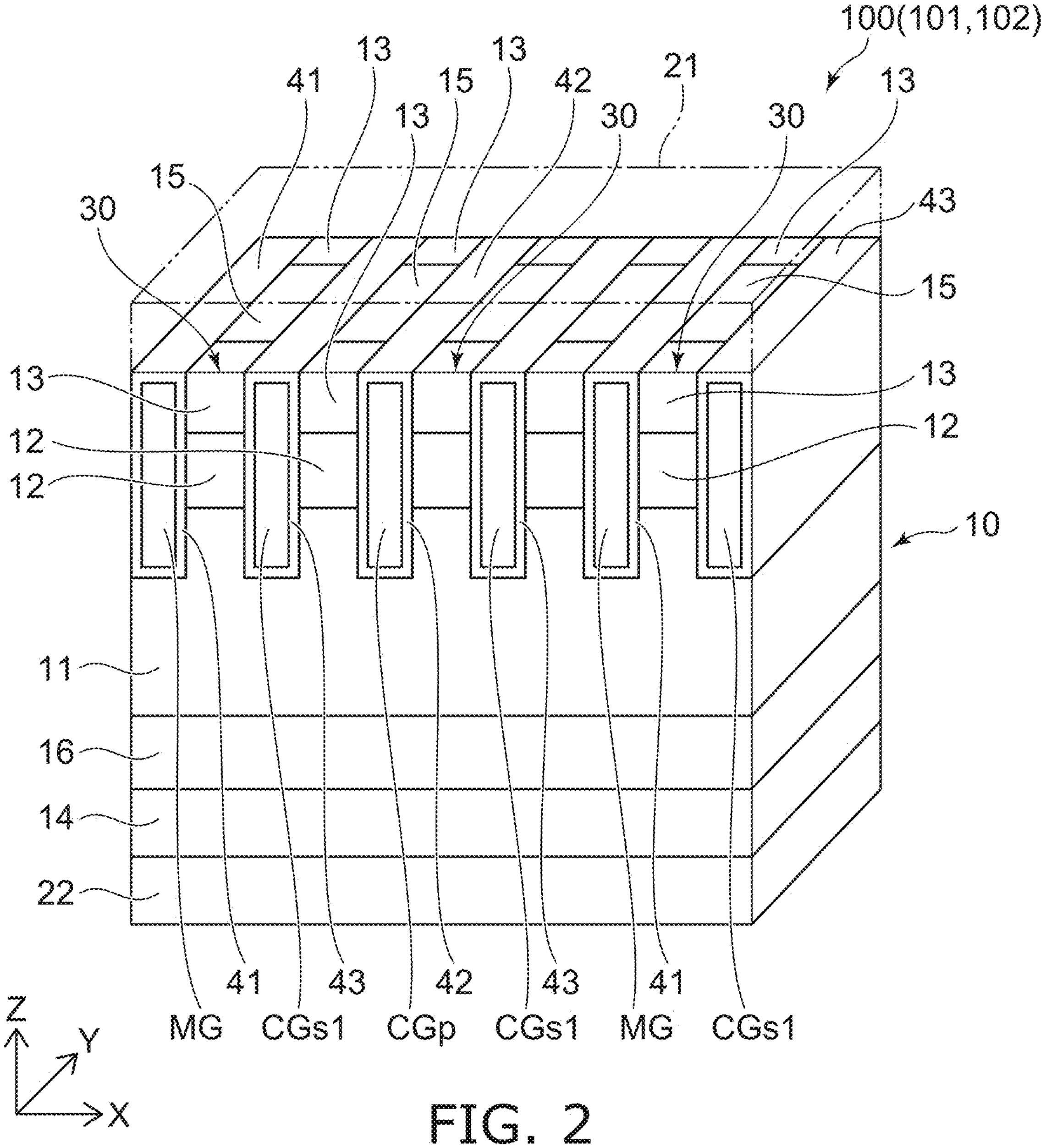
FIG. 2 is a cross-sectional perspective view of the semiconductor device of the embodiment.

The structure shown in FIG. 2 is multiply repeated in the second direction X. In other words, the multiple first gate electrodes MG, the multiple second gate electrodes CGp, and the multiple third gate electrodes CGs1 are arranged to be separated from each other in the second direction X. The first gate electrodes MG, the second gate electrodes CGp, and the third gate electrodes CGs1 each extend in the third direction Y.

For example, the multiple first gate electrodes MG are electrically connected to each other at the end portions in the third direction Y. For example, the multiple second gate electrodes CGp are electrically connected to each other at the end portions in the third direction Y. For example, the multiple third gate electrodes CGs1 are electrically connected to each other at the end portions in the third direction Y.

For example, the third gate electrode CGs1 is located between the first gate electrode MG and the second gate electrode CGp adjacent to each other in the second direction X. As the order of the gate electrodes in the second direction X, an example is shown in FIG. 2 in which the first gate electrode MG is adjacent to the third gate electrodes CGs1; the second gate electrode CGp is adjacent to the third gate electrodes CGs1; and the first gate electrode MG is not adjacent to the second gate electrode CGp. The percentage and/or density of the gate electrodes is not limited to the example shown in FIG. 2.

The first insulating film 41 is located between the first gate electrode MG and the semiconductor part 10. The first gate electrode MG is adjacent to the mesa part 30 with the first insulating film 41 interposed in the second direction X. The side surface in the second direction X of the first gate electrode MG faces the first semiconductor layer 11, the second semiconductor layer 12, the third semiconductor layer 13, and the fifth semiconductor layer 15 of the mesa part 30 via the first insulating film 41. The first insulating film 41 also is located between the emitter electrode 21 and the upper end of the first gate electrode MG.

The second insulating film 42 is located between the second gate electrode CGp and the semiconductor part 10. The second gate electrode CGp is adjacent to the mesa part 30 with the second insulating film 42 interposed in the second direction X. The side surface in the second direction X of the second gate electrode CGp faces the first semiconductor layer 11, the second semiconductor layer 12, the third semiconductor layer 13, and the fifth semiconductor layer 15 of the mesa part 30 via the second insulating film 42. The second insulating film 42 also is located between the emitter electrode 21 and the upper end of the second gate electrode CGp.

The third insulating film 43 is located between the third gate electrode CGs1 and the semiconductor part 10. The third gate electrode CGs1 is adjacent to the mesa part 30 with the third insulating film 43 interposed in the second direction X. The side surface in the second direction X of the third gate electrode CGs1 faces the first semiconductor layer 11, the second semiconductor layer 12, the third semiconductor layer 13, and the fifth semiconductor layer 15 of the mesa part 30 via the third insulating film 43. The third insulating film 43 also is located between the emitter electrode 21 and the upper end of the third gate electrode CGs1.

The first insulating film 41, the second insulating film 42, and the third insulating film 43 are, for example, silicon oxide films and/or silicon nitride films.

The first semiconductor device 101 and the second semiconductor device 102 are turned on and off alternately by the drive device 50. The second semiconductor device 102 is turned off in the period in which the first semiconductor device 101 is on; and the first semiconductor device 101 is turned off in the period in which the second semiconductor device 102 is on. Dead time, which is a period in which both the first and second semiconductor devices 101 and 102 are off, is set to prevent a through-current from flowing from the voltage source 200 to ground via the first and second semiconductor devices 101 and 102.

Figures 3A, 3B, 3C:
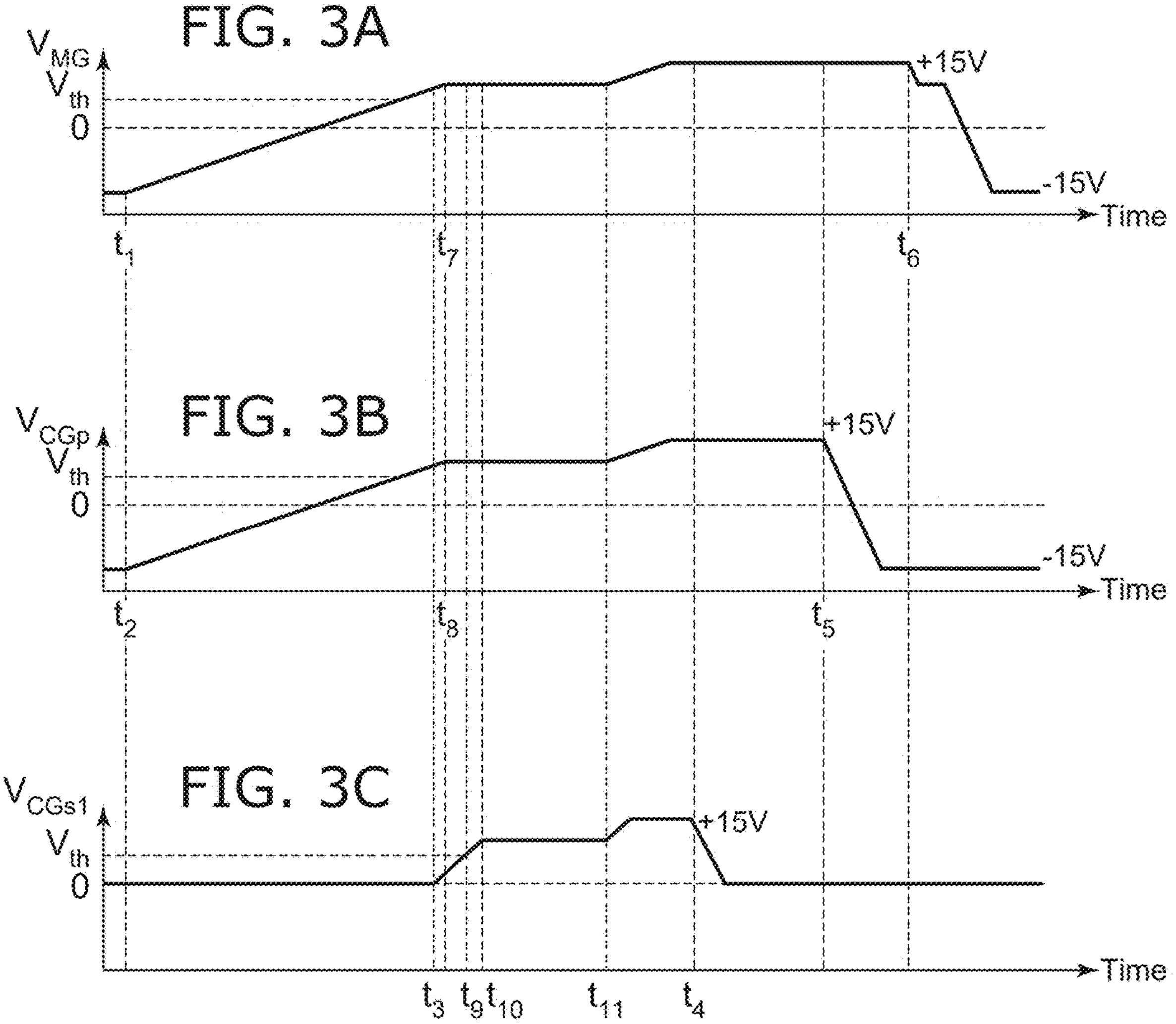
FIGS. 3A to 3C are timing charts of gate voltages of the semiconductor device of the first embodiment.

FIG. 3A is a timing chart of a first gate voltage $V_{MG}$ of the first gate electrode MG.

FIG. 3B is a timing chart of a second gate voltage $V_{CGp}$ of the second gate electrode CGp.

FIG. 3C is a timing chart of a third gate voltage $V_{CGs1}$ of the third gate electrode CGs1.

Threshold voltages of the first, second, and third gate electrodes MG, CGp, and CGs1 are respectively taken as a first threshold voltage, a second threshold voltage, and a third threshold voltage. For example, the first threshold voltage, the second threshold voltage, and the third threshold voltage are equal, and are represented by Vth in FIGS. 3A to 3C. Some fluctuation may occur in the first, second, and third threshold voltages due to manufacturing fluctuation of the semiconductor device.

In the semiconductor devices 101 and 102, in the period from when the first gate electrode MG is turned on until the first gate electrode MG is turned off, the on-period of the second gate electrode CGp is shorter than the on-period of the first gate electrode MG; and the on-period of the third gate electrode CGs1 is shorter than the on-period of the second gate electrode CGp. The rise of the first gate voltage $V_{MG}$ starts at a timing $t_1$; the rise of the third gate voltage $V_{CGs1}$ starts at a timing $t_3$ that is after the timing $t_1$; the fall of the third gate voltage $V_{CGs1}$ starts at a timing $t_4$ that is after the timing $t_3$; the fall of the second gate voltage $V_{CGp}$ starts at a timing $t_5$ that is after the timing $t_4$; and the fall of the first gate voltage $V_{MG}$ starts at a timing to that is after the timing $t_5$.

The semiconductor devices 101 and 102 are turned on and off by the first gate electrodes MG. When turning off the semiconductor devices 101 and 102, the second gate electrodes CGp are turned off before the first gate electrodes MG. When turning on the semiconductor devices 101 and 102, the third gate electrodes CGs1 are turned on for only a short period of time. By the first gate voltage $V_{MG}$ exceeding the first threshold voltage Vth, a first channel (an n-type inversion layer) is induced in the region of the second semiconductor layer 12 facing the first gate electrode MG. Electrons are injected from the emitter electrode 21 into the first semiconductor layer 11 via the third semiconductor layer 13 and the first channel. Accordingly, holes are injected from the fourth semiconductor layer 14 into the first semiconductor layer 11 via the sixth semiconductor layer 16. This state is called the first gate electrode MG being on. For example, the on-voltage of the first gate electrode MG can be set to +15 V.

By the second gate voltage $V_{CGp}$ exceeding the second threshold voltage Vth, a second channel (an n-type inversion layer) is induced in the region of the second semiconductor layer 12 facing the second gate electrode CGp. Electrons are injected from the emitter electrode 21 into the first semiconductor layer 11 via the third semiconductor layer 13 and the second channel. Accordingly, holes are injected from the fourth semiconductor layer 14 into the first semiconductor layer 11 via the sixth semiconductor layer 16. This state is called the second gate electrode CGp being on. For example, the on-voltage of the second gate electrode CGp can be set to +15 V.

For example, the first gate electrode MG and the second gate electrode CGp are turned on simultaneously.

By the third gate voltage $V_{CGs1}$ exceeding the third threshold voltage Vth, a third channel (an n-type inversion layer) is induced in the region of the second semiconductor layer 12 facing the third gate electrode CGs1. Electrons are injected from the emitter electrode 21 into the first semiconductor layer 11 via the third semiconductor layer 13 and the third channel. Accordingly, holes are injected from the fourth semiconductor layer 14 into the first semiconductor layer 11 via the sixth semiconductor layer 16. This state is called the third gate electrode CGs1 being on. For example, the on-voltage of the third gate electrode CGs1 can be set to +15 V.

At turn-on of the semiconductor devices 101 and 102, the turn-on loss can be reduced by increasing the electron injection amount into the first semiconductor layer 11 in a short period of time by turning the first gate electrode MG, the second gate electrode CGp, and the third gate electrode CGs1 on. At turn-on of the semiconductor devices 101 and 102, a low saturation current can be maintained and the short-circuit withstand capacity can be ensured by turning the third gate electrode CGs1 off (causing the third channel to disappear) before the first and second gate electrodes MG and CGp.

When the third gate voltage $V_{CGs1}$ drops below the third threshold voltage Vth, the third channel in the region of the second semiconductor layer 12 facing the third gate electrode CGs1 disappears. This state is called the third gate electrode CGs1 being off. For example, the off-voltage of the third gate electrode CGs1 can be set to 0 V.

When the second gate voltage $V_{CGp}$ drops below the second threshold voltage Vth, the second channel in the region of the second semiconductor layer 12 facing the second gate electrode CGp disappears. This state is called the second gate electrode CGp being off. The electron injection amount into the first semiconductor layer 11 can be reduced and the turn-off loss can be reduced by turning off the second gate electrode CGp before the first gate electrode MG. By setting the second gate voltage $V_{CGp}$ to a negative voltage, a fourth channel (a p-type inversion layer) and a fifth channel (a p-type inversion layer) are induced in the regions of the first and third semiconductor layers 11 and 13 facing the second gate electrode CGp. Holes are removed from the first semiconductor layer 11 into the emitter electrode 21 via the fourth channel, the second semiconductor layer 12, and the fifth channel. As a result, the carrier density of the first semiconductor layer 11 is reduced, and so the turn-off loss can be further reduced. For example, the off-voltage of the second gate electrode CGp can be set to −15 V.

By causing the first gate voltage $V_{MG}$ of the first gate electrode MG to drop below the first threshold voltage Vth after the second gate electrode CGp is turned off, the first channel in the region of the second semiconductor layer 12 facing the first gate electrode MG disappears. This state is called the first gate electrode MG being off. For example, the off-voltage of the first gate electrode MG can be set to −15 V.

Figures 4A, 4B:
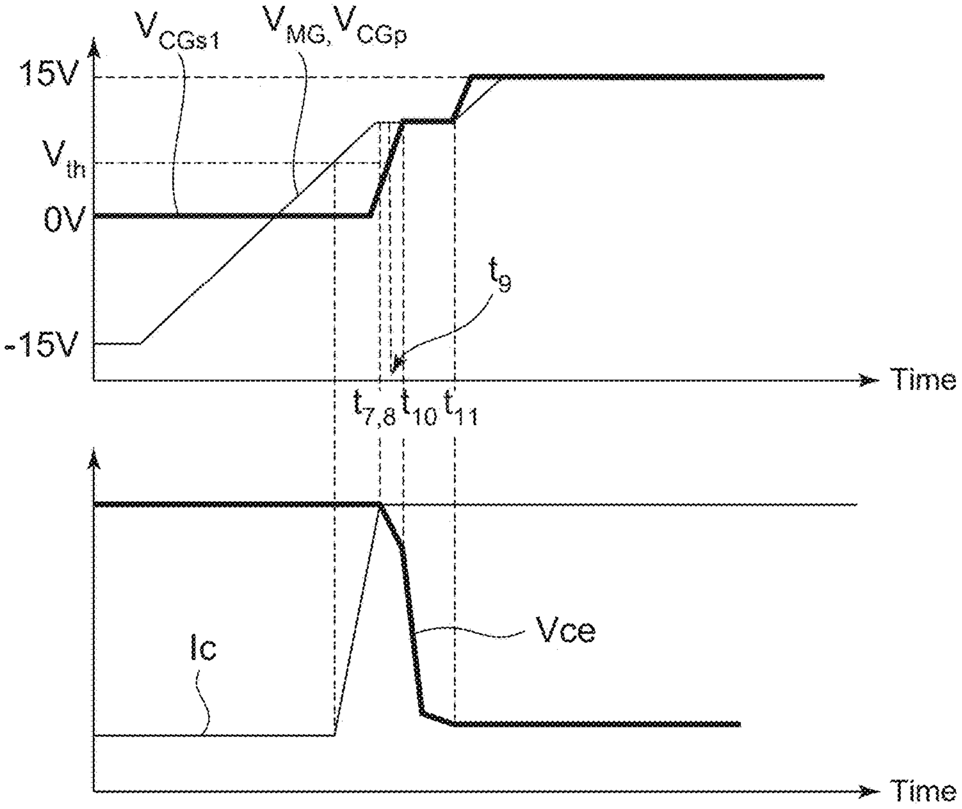
FIG. 4A is a timing chart of the gate voltage at turn-on of the semiconductor device of the first embodiment.
FIG. 4B is a graph showing the temporal change of a current Ic and a voltage Vce at turn-on of the semiconductor device of the first embodiment.

FIG. 4A is a timing chart at turn-on of the first, second, and third gate voltages $V_{MG}$, $V_{CGp}$, and $V_{CGs1}$. The first gate voltage $V_{MG}$ and the second gate voltage $V_{CGp}$ are illustrated by fine lines; and the third gate voltage $V_{CGs1}$ is illustrated by a thick line.

FIG. 4B is a graph showing the temporal changes of the current Ic and the voltage Vce at turn-on of the semiconductor device 100. The current Ic represents the current flowing between the collector electrode 22 and the emitter electrode 21. The voltage Vce represents the collector potential referenced to the emitter potential.

In FIGS. 4A and 4B, the current Ic starts to flow when the first gate voltage $V_{MG}$ and the second gate voltage $V_{CGp}$ exceed the threshold voltage Vth. After the first gate voltage $V_{MG}$ and the second gate voltage $V_{CGP}$ exceed the threshold voltage Vth, a first Miller period of the first gate voltage $V_{MG}$ starts at a timing $t_7$; and a second Miller period of the second gate voltage $V_{CGp}$ starts at a timing $t_8$. For example, the timings $t_7$ and $t_8$ are the same timing. The Miller period is the period in which the parasitic capacitance between the collector electrode and each gate electrode is charged, and the gate voltage of each gate electrode does not change.

The rise of the current Ic is completed at the timing at which the first Miller period and the second Miller period start. The fall of the voltage Vce starts when the first Miller period and the second Miller period start. The first Miller period of the first gate voltage $V_{MG}$, the second Miller period of the second gate voltage $V_{CGp}$, and the third Miller period of the third gate voltage $V_{CGs1}$ end at a timing $t_{11}$.

According to the embodiment, a timing to at which the third gate voltage $V_{CGs1}$ of the third gate electrode CGs1 reaches the third threshold voltage Vth and a start timing $t_{10}$ of the third Miller period of the third gate voltage $V_{CGs1}$ are within the first Miller period of the first gate voltage $V_{MG}$ (between the timing ty and the timing $t_{11}$) and within the second Miller period of the second gate voltage $V_{CGp}$ (between the timing $t_8$ and the timing $t_{11}$).

Because the rise of the current Ic is completed at the timing at which the first Miller period and the second Miller period start, dIc/dt (the change amount of the current Ic with respect to the time of the rise of the current Ic) can be reduced by setting the timing $t_9$ at which the third gate voltage $V_{CGs1}$ reaches the third threshold voltage Vth to be after the start timing ty of the first Miller period and the start timing $t_5$ of the second Miller period. As a result, the amplitude width and maximum value of the ringing of the current Ic at turn-on can be reduced, and the current noise can be reduced.

As shown in FIG. 4B, dVce/dt (the change amount of the voltage Vce with respect to the time of the fall of the voltage Vce) increases when the third Miller period of the third gate voltage $V_{CGs1}$ starts at the timing $t_{10}$ after the third gate voltage $V_{CGs1}$ exceeds the third threshold voltage Vth. By setting the start timing $t_{10}$ of the third Miller period of the third gate voltage $V_{CGs1}$ to be within the first Miller period of the first gate voltage $V_{MG}$ (between the timing $t_7$ and the timing $t_{11}$) and within the second Miller period of the second gate voltage $V_{CGp}$ (between the timing $t_5$ and the timing $t_{11}$), the fall of the voltage Vce can be faster, and the turn-on loss can be reduced.

In other words, according to the embodiment, the turn-on loss can be reduced while reducing the current noise.

Figure 5A:
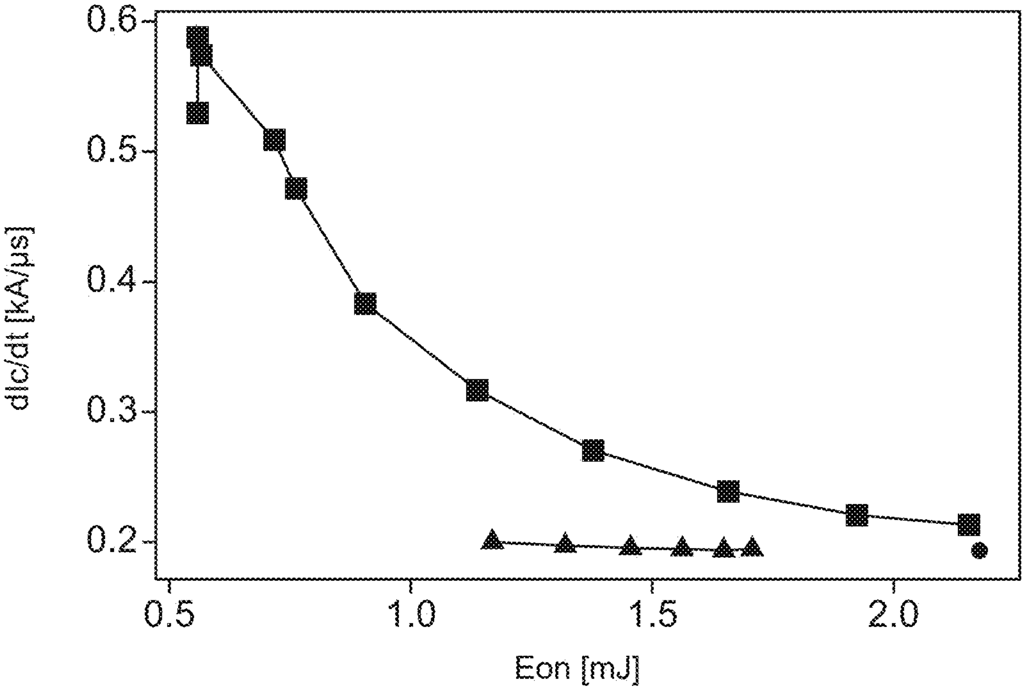
FIG. 5A is a graph showing measurement results of a turn-on loss Eon and dIc/dt of an IGBT.

FIG. 5A is a graph showing measurement results of the turn-on loss Eon (mJ) and dIc/dt (kA/μs) at turn-on when a current Ic of 30 A is caused to flow in the IGBT.

Figure 5B:
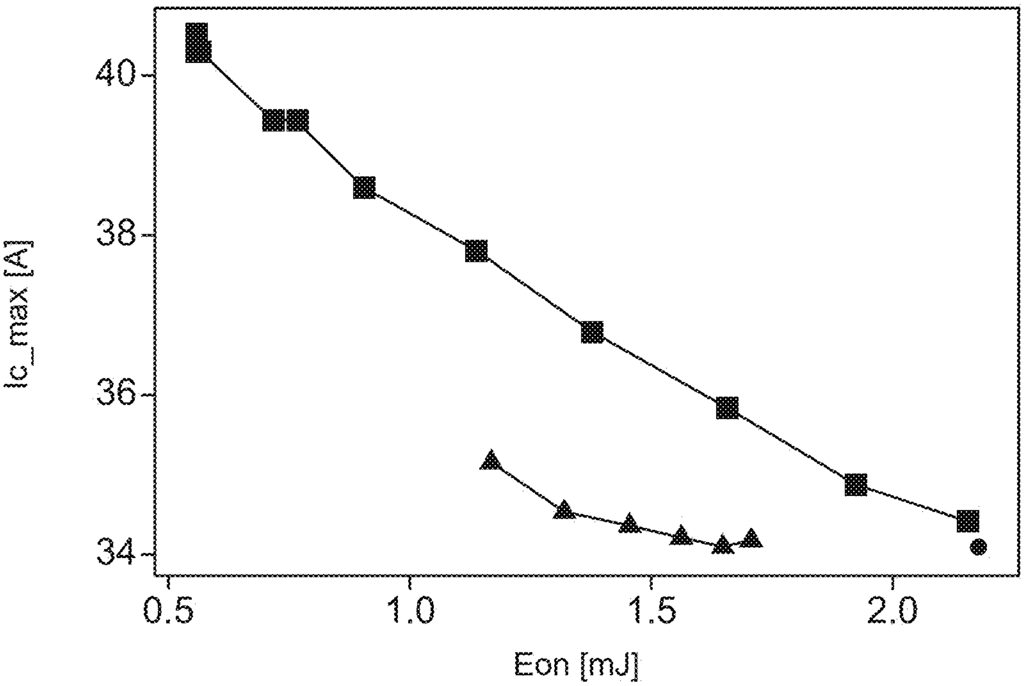
FIG. 5B is a graph showing measurement results of the turn-on loss Eon and a maximum value Ic_max of current ringing of the IGBT.

FIG. 5B is a graph showing measurement results of the turn-on loss Eon (mJ) and the maximum value Ic_max (A) of the ringing of the current Ic at turn-on when a current Ic of 30 A is caused to flow in the IGBT.

The circles in the graphs of FIGS. 5A and 5B show measurement results of an IGBT of a first comparative example having a single-gate structure including one system of gate electrodes. The quadrilaterals show measurement results of an IGBT of a second comparative example, which is an IGBT having a triple-gate structure in which the three systems of gate electrodes simultaneously reach the threshold voltage at turn-on, and the Miller periods start simultaneously. The triangles show measurement results of the IGBT of the embodiment above. The periods between the rise start timing $t_1$ of the first gate voltage and the rise start timing $t_3$ of the third gate voltage are different between the quadrilateral points; and the periods between the rise start timing $t_1$ of the first gate voltage and the rise start timing $t_3$ of the third gate voltage are different between the triangular points as well.

The results of FIG. 5A show that according to the embodiment, Eon can be less than that of the first comparative example; and dIc/dt can be less than that of the second comparative example for the same Eon.

The results of FIG. 5B show that according to the embodiment, Eon can be less than that of the first comparative example; and Ic_max can be less than that of the second comparative example for the same Eon.

Figure 6A:
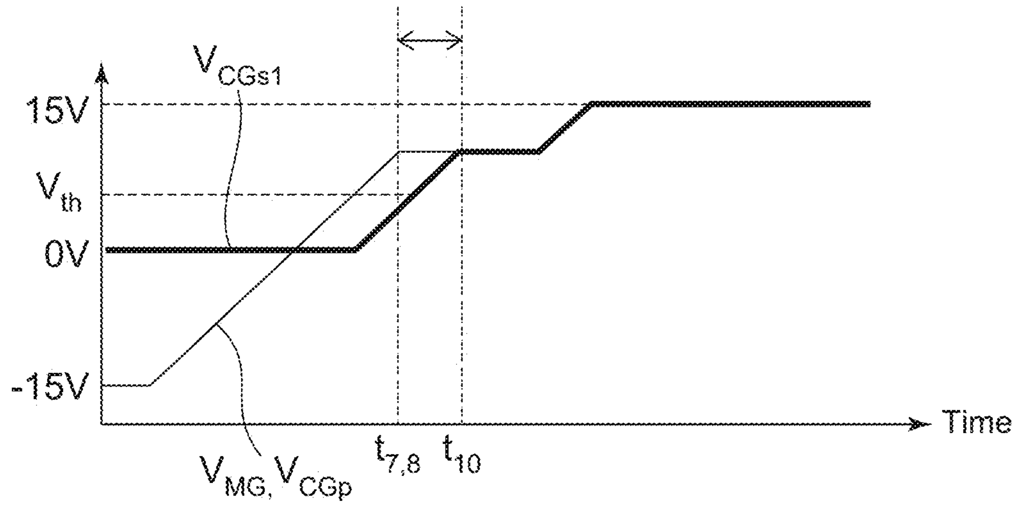
FIGS. 6A and 6B are timing charts of gate voltages at turn-on of the semiconductor device of the first embodiment.
Figure 6B:
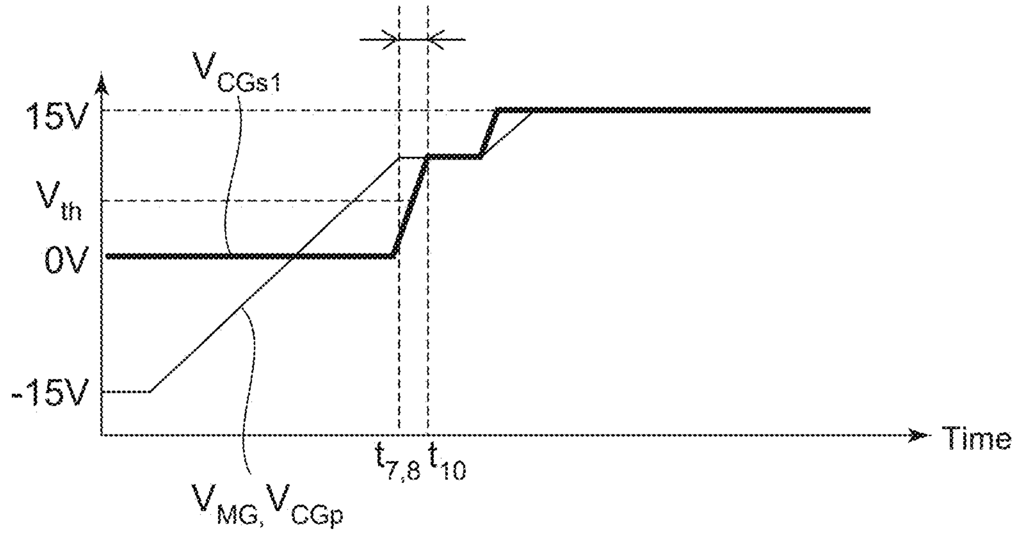

FIGS. 6A and 6B are timing charts of gate voltages at turn-on of the semiconductor device of the embodiment similar to FIG. 4A.

In the semiconductor device of FIG. 6A, the gate time constant of the first gate electrode MG, the gate time constant of the second gate electrode CGp, and the gate time constant of the third gate electrode CGs1 are equal.

In the semiconductor device of FIG. 6B, the gate time constant of the third gate electrode CGs1 is less than the gate time constant of the first gate electrode MG and the gate time constant of the second gate electrode CGp.

For example, the gate time constants can be adjusted using resistances R of the gate wiring parts 81 to 83 shown in FIG. 1.

By setting the gate time constant of the third gate electrode CGs1 to be less than the gate time constant of the first gate electrode MG and the gate time constant of the second gate electrode CGp, the period from the start timing ty of the first Miller period of the first gate voltage $V_{MG}$ and the start timing $t_5$ of the second Miller period of the second gate voltage $V_{CGp}$ to the timing $t_{10}$ at which the third Miller period of the third gate voltage $V_{CGs1}$ starts can be less than when the gate time constants of the gate electrodes are equal. As a result, the fall of the voltage Vce can be faster, and the turn-on loss is reduced more easily.

Second Embodiment

Figure 7A:
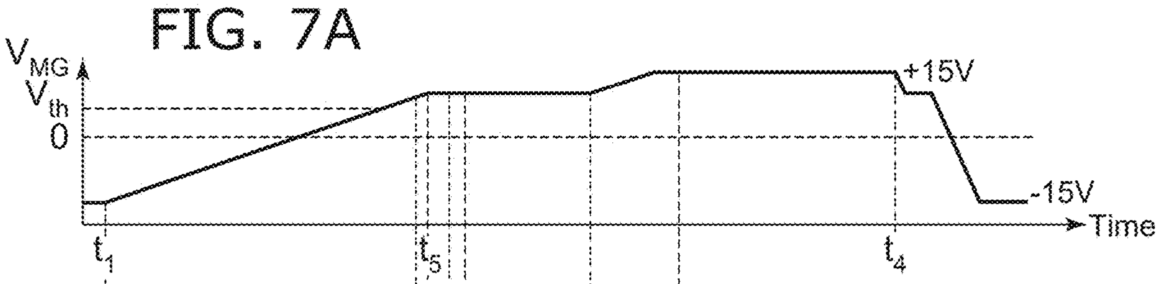
FIGS. 7A and 7B are timing charts of gate voltages of a semiconductor device of a second embodiment.

FIG. 7A is a timing chart of the first gate voltage $V_{MG}$ of the first gate electrode MG of a semiconductor device of a second embodiment.

Figure 7B:
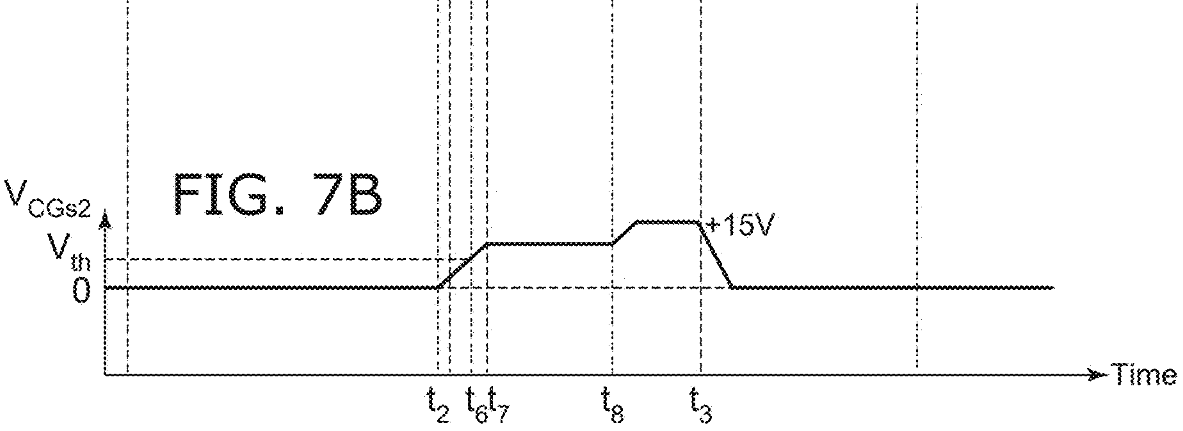

FIG. 7B is a timing chart of a second gate voltage $V_{CGs2}$ of a second gate electrode CGs2 of the semiconductor device of the second embodiment.

The semiconductor device of the second embodiment differs from the semiconductor device of the first embodiment in that two systems of gate electrodes are included. The semiconductor device of the second embodiment includes an IGBT having a double-gate structure including the first and second gate electrodes MG and CGs2 configured to be electrically controlled independently from each other. Among the three systems of gate electrodes of the semiconductor device of the first embodiment, the semiconductor device of the second embodiment does not include the second gate electrode CGp.

The configuration and operations of the second gate electrode CGs2 of the semiconductor device of the second embodiment correspond to the configuration and operations of the third gate electrode CGs1 of the semiconductor device of the first embodiment. The second gate voltage $V_{CGs2}$ of the second gate electrode CGs2 according to the second embodiment corresponds to the third gate voltage $V_{CGs1}$ of the third gate electrode CGs1 according to the first embodiment. The second threshold voltage according to the second embodiment corresponds to the third threshold voltage according to the first embodiment. The second Miller period according to the second embodiment corresponds to the third Miller period according to the first embodiment.

According to the second embodiment as well, as shown in FIGS. 7A and 7B, the timing $t_6$ at which the second gate voltage $V_{CGs2}$ of the second gate electrode CGs2 reaches the second threshold voltage Vth and the start timing ty of the second Miller period of the second gate voltage $V_{CGs2}$ are within the first Miller period of the first gate voltage $V_{MG}$ (between the timing $t_5$ and the timing $t_8$).

As a result, the amplitude width and maximum value of the ringing of the current Ic at turn-on can be reduced, and the current noise can be reduced. The fall of the voltage Vce can be faster, and the turn-on loss can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:

a first gate electrode, a second gate electrode, and a third gate electrode, the first gate electrode, the second gate electrode, and the third gate electrode being configured to be controlled independently from each other, an on-period of the second gate electrode being shorter than an on-period of the first gate electrode in a period from when the first gate electrode is turned on until the first gate electrode is turned off, an on-period of the third gate electrode being shorter than the on-period of the second gate electrode in the period from when the first gate electrode is turned on until the first gate electrode is turned off, a timing at which a third gate voltage of the third gate electrode reaches a third threshold voltage and a start timing of a third Miller period of the third gate voltage being within a first Miller period of a first gate voltage of the first gate electrode and within a second Miller period of a second gate voltage of the second gate electrode, a gate time constant of the third gate electrode being less than a gate time constant of the first gate electrode and a gate time constant of the second gate electrode.

2. The semiconductor device according to claim 1, wherein the semiconductor device includes an IGBT (Insulated Gate Bipolar Transistor).

3. A semiconductor module, comprising:

the semiconductor device according to claim 1; and a drive circuit electrically connected with the first, second, and third gate electrodes.

4. The module according to claim 3, wherein the semiconductor device includes a first semiconductor device and a second semiconductor device connected in series between a voltage source and a ground, and the first semiconductor device and the second semiconductor device each include the first, second, and third gate electrodes.

5. A semiconductor device, comprising:

a first gate electrode and a second gate electrode, the first gate electrode and the second gate electrode being configured to be controlled independently from each other, an on-period of the second gate electrode being shorter than an on-period of the first gate electrode in a period from when the first gate electrode is turned on until the first gate electrode is turned off, a timing at which a second gate voltage of the second gate electrode reaches a second threshold voltage and a start timing of a second Miller period of the second gate voltage being within a first Miller period of a first gate voltage of the first gate electrode, a gate time constant of the second gate electrode being less than a gate time constant of the first gate electrode.

6. The semiconductor device according to claim 5, wherein the semiconductor device includes an IGBT (Insulated Gate Bipolar Transistor).

7. A semiconductor module, comprising:

the semiconductor device according to claim 4; and a drive circuit electrically connected with the first and second gate electrodes.

8. The module according to claim 7, wherein the semiconductor device includes a first semiconductor device and a second semiconductor device connected in series between a voltage source and a ground, and the first semiconductor device and the second semiconductor device each include the first and second gate electrodes.

* * * * *